US010554017B2

(12) United States Patent
Han et al.

(10) Patent No.: US 10,554,017 B2
(45) Date of Patent: Feb. 4, 2020

(54) METHOD AND DEVICE CONCERNING III-NITRIDE EDGE EMITTING LASER DIODE OF HIGH CONFINEMENT FACTOR WITH LATTICE MATCHED CLADDING LAYER

(71) Applicant: Yale University, New Haven, CT (US)

(72) Inventors: Jung Han, Woodbridge, CT (US); Yufeng Li, Shaanxi (CN); Ge Yuan, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/574,739

(22) PCT Filed: May 19, 2016

(86) PCT No.: PCT/US2016/033270
§ 371 (c)(1),
(2) Date: Nov. 16, 2017

(87) PCT Pub. No.: WO2016/187421
PCT Pub. Date: Nov. 24, 2016

(65) Prior Publication Data
US 2018/0152003 A1 May 31, 2018

Related U.S. Application Data

(60) Provisional application No. 62/163,811, filed on May 19, 2015.

(51) Int. Cl.
*H01S 5/20* (2006.01)
*H01S 5/30* (2006.01)
(Continued)

(52) U.S. Cl.
CPC .......... *H01S 5/2009* (2013.01); *H01S 5/2081* (2013.01); *H01S 5/305* (2013.01);
(Continued)

(58) Field of Classification Search
CPC ....... H01S 5/18–18397; H01S 5/22–24; H01S 5/34333; H01S 5/3211; H01S 5/3213; H01S 5/3214; H01S 5/3219
See application file for complete search history.

(56) References Cited

U.S. PATENT DOCUMENTS 5,262,021 A    11/1993  Volker et al.
5,307,361 A *  4/1994  Kahen ............... B82Y 20/00
                                              372/45.01
(Continued)

FOREIGN PATENT DOCUMENTS

CN    101443887 A    5/2009
CN    102782818 A    11/2012
(Continued)

OTHER PUBLICATIONS

International Search Report and Written Opinion for International Application No. PCT/US2013/046852, dated Oct. 29, 2013.
(Continued)

*Primary Examiner* — Xinning (Tom) Niu
*Assistant Examiner* — Sean P Hagan
(74) *Attorney, Agent, or Firm* — Wolf, Greenfield & Sacks, P.C.

(57) ABSTRACT

Edge-emitting laser diodes having high confinement factors and lattice-matched, porous cladding layers are described. The laser diodes may be formed from layers of III-nitride material. A cladding layer may be electrochemically etched to form a porous cladding layer having a high refractive index contrast with an active junction of the device. A transparent conductive oxide layer may be deposited to form a top-side cladding layer with high refractive index contrast and low resistivity.

24 Claims, 10 Drawing Sheets

(51) Int. Cl.
  *H01S 5/343* (2006.01)
  *H01S 5/32* (2006.01)
  *H01L 21/306* (2006.01)

(52) U.S. Cl.
  CPC .......... *H01S 5/3211* (2013.01); *H01S 5/3213* (2013.01); *H01S 5/3219* (2013.01); *H01S 5/34333* (2013.01); *H01L 21/306* (2013.01); *H01S 2304/04* (2013.01)

(56) References Cited

U.S. PATENT DOCUMENTS

| | | | |
|---|---|---|---|
| 5,502,787 A * | 3/1996 | Capasso | B82Y 20/00 |
| | | | 372/46.012 |
| 5,509,026 A | 4/1996 | Sasaki et al. | |
| 5,644,156 A | 7/1997 | Suzuki et al. | |
| 5,818,861 A | 10/1998 | Tan et al. | |
| 5,919,430 A | 7/1999 | Hasenzahl et al. | |
| 6,306,672 B1 | 10/2001 | Kim | |
| 6,320,206 B1 | 11/2001 | Coman et al. | |
| 6,537,838 B2 | 3/2003 | Stockman | |
| 6,597,017 B1 | 7/2003 | Seko et al. | |
| 6,597,490 B2 | 7/2003 | Tayebati | |
| 6,759,310 B2 | 7/2004 | Hiroshi | |
| 6,990,132 B2 | 1/2006 | Kneissl et al. | |
| 7,271,417 B2 | 9/2007 | Chen | |
| 7,750,234 B2 | 7/2010 | Deng et al. | |
| 7,751,455 B2 | 7/2010 | Kneissl | |
| 7,923,275 B2 | 4/2011 | Nakagawa | |
| 7,989,323 B2 | 8/2011 | Shenai-Khatkhate | |
| 8,343,788 B2 | 1/2013 | Kuo et al. | |
| 8,344,409 B2 | 1/2013 | Peng et al. | |
| 8,497,171 B1 | 7/2013 | Wu et al. | |
| 8,507,925 B2 | 8/2013 | Kuo et al. | |
| 8,519,430 B2 | 8/2013 | Peng et al. | |
| 9,206,524 B2 | 12/2015 | Zhang et al. | |
| 9,356,187 B2 | 5/2016 | Ryu et al. | |
| 9,583,353 B2 | 2/2017 | Han | |
| 2002/0036295 A1 | 3/2002 | Nunoue et al. | |
| 2002/0070125 A1 | 6/2002 | Ng et al. | |
| 2002/0075929 A1 | 6/2002 | Cunningham | |
| 2002/0153595 A1 | 10/2002 | Tayanaka | |
| 2002/0158265 A1 | 10/2002 | Eisenbeiser | |
| 2003/0178633 A1 | 9/2003 | Flynn et al. | |
| 2003/0189963 A1 | 10/2003 | Deppe et al. | |
| 2004/0021147 A1 | 2/2004 | Ishibashi et al. | |
| 2004/0104398 A1 | 6/2004 | Hon et al. | |
| 2005/0029224 A1 | 2/2005 | Aspar et al. | |
| 2005/0184307 A1 | 8/2005 | Li et al. | |
| 2005/0224816 A1 | 10/2005 | Kim et al. | |
| 2005/0242365 A1 | 11/2005 | Yoo | |
| 2006/0046513 A1 | 3/2006 | Shea et al. | |
| 2006/0110926 A1 | 5/2006 | Hu et al. | |
| 2006/0199353 A1 | 9/2006 | Kub et al. | |
| 2007/0007241 A1 | 1/2007 | DeLouise | |
| 2007/0040162 A1 | 2/2007 | Song | |
| 2007/0085100 A1 | 4/2007 | Diana et al. | |
| 2007/0111345 A1 | 5/2007 | Wong et al. | |
| 2007/0194330 A1 | 8/2007 | Ibbetson et al. | |
| 2007/0284607 A1 | 12/2007 | Epler et al. | |
| 2008/0029773 A1 | 2/2008 | Jorgenson | |
| 2008/0067532 A1 | 3/2008 | Watson et al. | |
| 2008/0179605 A1 | 7/2008 | Takase et al. | |
| 2008/0280140 A1 | 11/2008 | Ferrari et al. | |
| 2008/0285610 A1 | 11/2008 | Hall et al. | |
| 2008/0296173 A1 | 12/2008 | Mishra | |
| 2008/0298419 A1 | 12/2008 | Hori et al. | |
| 2009/0001416 A1 | 1/2009 | Chua et al. | |
| 2009/0117675 A1 | 5/2009 | Yamanaka et al. | |
| 2009/0140274 A1 | 6/2009 | Wierer, Jr. et al. | |
| 2009/0143227 A1 | 6/2009 | Dubrow et al. | |
| 2009/0168819 A1 | 7/2009 | Otoma | |
| 2009/0173373 A1 | 7/2009 | Walukiewicz et al. | |
| 2010/0195689 A1 | 8/2010 | Ariga et al. | |
| 2010/0246625 A1 * | 9/2010 | Kawashima | B82Y 20/00 |
| | | | 372/45.01 |
| 2010/0270649 A1 | 10/2010 | Ishibashi et al. | |
| 2010/0317132 A1 | 12/2010 | Rogers et al. | |
| 2011/0076854 A1 | 3/2011 | Takeo et al. | |
| 2011/0101391 A1 | 5/2011 | Mild et al. | |
| 2011/0188528 A1 * | 8/2011 | Kisin | B82Y 20/00 |
| | | | 372/44.011 |
| 2012/0018753 A1 | 1/2012 | Hao et al. | |
| 2012/0025231 A1 | 2/2012 | Krames et al. | |
| 2012/0068214 A1 | 3/2012 | Kuo et al. | |
| 2012/0189030 A1 * | 7/2012 | Miyoshi | B82Y 20/00 |
| | | | 372/45.012 |
| 2012/0205665 A1 * | 8/2012 | Nam | H01L 29/2003 |
| | | | 257/76 |
| 2013/0011656 A1 * | 1/2013 | Zhang | C30B 29/406 |
| | | | 428/312.8 |
| 2013/0050686 A1 | 2/2013 | Wunderer et al. | |
| 2013/0134457 A1 | 5/2013 | Peng et al. | |
| 2013/0140517 A1 | 6/2013 | Tang et al. | |
| 2013/0210180 A1 | 8/2013 | Wang | |
| 2013/0248911 A1 | 9/2013 | Hwang et al. | |
| 2013/0328102 A1 | 12/2013 | Peng et al. | |
| 2013/0334555 A1 | 12/2013 | Hsieh et al. | |
| 2014/0003458 A1 * | 1/2014 | Han | H01L 218/30612 |
| | | | 372/45.01 |
| 2014/0048830 A1 | 2/2014 | Kuo et al. | |
| 2014/0064313 A1 | 3/2014 | Sato et al. | |
| 2014/0191369 A1 | 7/2014 | Tsuchiya et al. | |
| 2014/0339566 A1 | 11/2014 | Seo et al. | |
| 2015/0303655 A1 | 10/2015 | Han et al. | |
| 2016/0153113 A1 | 6/2016 | Zhang et al. | |
| 2016/0197151 A1 | 7/2016 | Han et al. | |
| 2017/0133826 A1 | 5/2017 | Han | |
| 2017/0237234 A1 | 8/2017 | Han et al. | |

FOREIGN PATENT DOCUMENTS

| | | |
|---|---|---|
| CN | 103762286 A | 4/2014 |
| JP | H05-315316 A | 11/1993 |
| JP | H10-135500 A | 5/1998 |
| JP | H11-195562 A | 7/1999 |
| JP | 2000-349267 A | 12/2000 |
| JP | 2001-223165 A | 8/2001 |
| JP | 2004-055611 A | 2/2004 |
| JP | 2005-244089 A | 9/2005 |
| JP | 2007-073945 A | 3/2007 |
| JP | 2007-518075 A | 7/2007 |
| JP | 2007-335879 A | 12/2007 |
| JP | 2009-055056 A | 3/2009 |
| JP | 2009-067658 A | 4/2009 |
| JP | 2009-231833 A | 10/2009 |
| JP | 2009-239034 A | 10/2009 |
| JP | 2010-218510 A | 9/2010 |
| KR | 2000-0038997 A | 7/2000 |
| KR | 10-0480764 B1 | 6/2005 |
| WO | WO 2005/066612 A2 | 7/2005 |
| WO | WO 2009/048265 A1 | 4/2009 |
| WO | WO 2011/094391 A1 | 8/2011 |
| WO | WO 2013/050686 A1 | 4/2013 |

OTHER PUBLICATIONS

International Preliminary Report on Patentability for International Application No. PCT/US2013/046852, dated Jan. 8, 2015.
Extended European Search Report for European Application No. 11737629.3, dated Oct. 12, 2017.
International Search Report and Written Opinion for International Application No. PCT/US2011/022701, dated Apr. 8, 2011.
International Preliminary Report on Patentability, dated Aug. 9, 2012 for Application No. PCT/US2011/022701.
Extended European Search Report for European Application No. 15846362.0, dated Apr. 24, 2018.
International Search Report and Written Opinion for International Application No. PCT/US2015/053254, dated Dec. 29, 2015.
International Preliminary Report on Patentability for International Application No. PCT/US2015/053254, dated Apr. 13, 2017.

(56) References Cited

OTHER PUBLICATIONS

Extended European Search Report for European Application No. 16797298.3, dated Dec. 3, 2018.
International Search Report and Written Opinion for International Application No. PCT/US2016/033270, datedd Aug. 25, 2016.
International Preliminary Report on Patentability for International Application No. PCT/US2016/033270, dated Nov. 30, 2017.
Amano et al., P-Type Conduction in Mg-Doped GaN Treated with Low-Energy Electron Beam Irradiation (LEEBI). Jpn J Appl Phys. 1989;28:L2112-4.
Bernardini et al., Spontaneous polarization and piezoelectric constants of III-V nitrides. Phys. Rev. B. 1997;56(16):R10024-7.
Bour et al., AlGaInN MQW Laser Diodes. III-V Nitride Semiconductors Applications and Devices. E.T. Yu (Ed.). Taylor and Francis Books, Inc., New York, NY, vol. 16, Chapter 10. 2003.
Bour et al., Design and performance of asymmetric waveguide nitride laser diodes. IEEE J Quantum Electron. 2000;36(2):184-191. doi: 10.1109/3.823464.
Chen et al., Flexible, Compliant GaN Nanomembranes for Photonic Applications. $10^{th}$ International Conference on Nitride Semiconductors. Abstract. Aug. 25, 2013. 2 pages.
Chen et al., High reflectance membrane-based distributed Bragg reflectors for GaN photonics. Appl Phys Lett. 2012;101:221104.
Chen, et al., Nanopores in GaN by electrochemical anodization in hydrofluoric acid: formation and mechanism. J. App. Phys. 2012;112:064303.
Choquette et al., Selective Oxidation of Buried AlGaAs for Fabrication of Vertical-Cavity Lasers. Conference: Spring meeting of the Materials Research Society (MRS, San Francisco, CA, Apr. 8-12, 1996. OSTI 244633. Jun. 1996. 10 pages.
Chung et al., Effect of Oxygen on the Activation of Mg Acceptor in GaN Epilayers Grown by Metalorganic Chemical Vapor Deposition. Jpn J Appl Phys. 2000;39(1,8):4749-50.
Dorsaz et al., Selective oxidation of AlInN layers for current confinement in Ill-nitride devices. Appl Phys Lett. 2005;87:072102.
Eiting et al., Growth of low resistivity p-type GaN by metal organic chemical vapour deposition. Electron Lett. Nov. 6, 1997;33(23):1987-1989. doi: 10.1049/e1.19971257.
Gautier et al., Observations of Macroporous Gallium Nitride Electrochemically Etched from High Doped Single Crystal Wafers in HF Based Electrolytes. ECS J of Solid State Science and Technology. 2013;2(4):P146-P148.
Higuchi et al., Room-Temperature CW Lasing of a GaN-Based Vertical-Cavity Surface-Emitting Laser by Current Injection. Appl Phys Express. 2008;1(12):121102. doi: 10.1143/APEX.1.121102.
Holder et al., Demonstration of nonpolar GaN based vertical-cavity surface-emitting lasers. Proc SPIE. Mar. 13, 2013;8639:863906. doi: 10.1117/12.2008277.
Jeon et al., Investigation of Mg doping in high-Al content p-type $Al_xGa_{1-x}N$ ($0.3<x<0.5$). Appl Phys Lett. 2005;86:082107. doi: 10.1063/1.1867565.
Jiang et al., Semiconductor lasers: Expanding into blue and green. Nat Photon. 2011;5:521-2.
Kamiura et al., Photo-Enhanced Activation of Hydrogen-Passivated Magnesium in P-Type GaN Films. Jpn J Appl Phys. 1998;37(2,8B):L970-1.
Kasahara et al., Demonstration of Blue and Green GaN-Based Vertical-Cavity Surface-Emitting Lasers by Current Injection at Room Temperature. Appl Phys Express. 2011;4(7):072103. doi: 10.1143/APEX.4.072103.
Kiefer et al., Si/Ge junctions formed by nanomembrane bonding. ACS Nano. Feb. 22, 2011;5(2):1179-89. doi: 10.1021/nn103149c. Epub Jan. 19, 2011 11 pages.
Kim et al., Reactivation of Mg acceptor in Mg-doped GaN by nitrogen plasma treatment. Appl Phys Lett. May 22, 2000;76(21):3079-81.
Kozodoy et al., Enhanced Mg doping efficiency in $Al_{0.2}Ga_{0.8}N$/GaN superlattices. Appl Phys Lett. 1999;74:3681. doi: 10.1063/1.123220.
Krishnamoorthy et al., InGaN/GaN tunnel junctions for hole injection in GaN light emitting diodes. Appl Phys Lett. Jun. 10, 2014;105(14):141104. doi: 10.1063/1.4897342. 16 pages.
Kurokawa et al., Multijunction GaInN-based solar cells using a tunnel junction. Appl Phys Express. Mar. 3, 2014;7(3):034104.1-4.
Kuwano et al., Lateral Hydrogen Diffusion at p-GaN Layers in Nitride-Based Light Emitting Diodes with Tunnel Junctions. Jpn J Appl Phys. Aug. 20, 2013;52(8S):08JK12.1-3.
Laino et al., Substrate Modes of (Al,In)GaN Semiconductor Laser Diodes on SiC and GaN Substrates. IEEE J Quantum Electron. 2007:43(1):16-24. doi: 10.1109/JQE.2006.884769.
Lin et al., Current steering effect of GaN nanoporous structure. Thin Solid Films. Nov. 2014;570(Part B):293-7.
Lu et al., CW lasing of current injection blue GaN-based vertical cavity surface emitting laser. Appl Phys Lett. 2008;92:141102.
Myers et al., Diffusion, release, and uptake of hydrogen in magnesium-doped gallium nitride: Theory and experiment. J Appl Phys. Mar. 15, 2001;89(6):3195-202.
Nagahama et al., High-Power and Long-Lifetime InGaN Multi-Quantum-Well Laser Diodes Grown on Low-Dislocation-Density GaN Substrates. Jpn J Appl Phys. 2000;39, part 2(7a):L647. doi: 10.1143/JJAP.39.L647.
Nakamura et al., Hole Compensation Mechanism of P-Type GaN Films. Jpn J Appl Phys. May 1992;31(1,5A):1258-66.
Nakamura et al., The Blue Laser Diode: The Complete Story. Springer. 2000. pp. 24-28, 237-239.
Nakayama et al., Electrical Transport Properties of p-GaN. Jpn J Appl Phys. 1996;35, Part 2(3A):L282. doi: 10.1143/JJAP.35.L282.
Okamoto et al., Pure Blue Laser Diodes Based on Nonpolar m-Plane Gallium Nitride with InGaN Waveguiding Layers. Jpn J Appl Phys. 2007;46:L820. doi: 10.1143/JJAP.46.L820.
Pandey et al., Formation of self-organized nanoporous anodic oxide from metallic gallium. Langmuir. 2012;28(38):13705-11.
Park et al., Doping selective lateral electrochemical etching of GaN for chemical lift-off. Jun. 5, 2009. Applied Physics Letters. AIP Publishing LLC, US. vol. 94(22) pp. 221907-1-221907-3.
Park et al., High Diffuse Reflectivity of Nanoporous GaN Distributed Bragg Reflector Formed by Electrochemical Etching. Applied Physics Express. Jun. 14, 2013;4;6(7):072201-1-4.
Paskiewicz et al., Defect-free single-crystal SiGe: a new material from nanomembrane strain engineering. ACS Nano. Jul. 26, 2011;5(7):5814-22. doi: 10.1021/nn201547k. Epub Jun. 16, 2011.
Piprek, Blue light emitting diode exceeding 100% quantum efficiency. Phys Status Solidi RRL. Feb. 4, 2014;8(5):424-6. doi: 10.1002/pssr.201490027.
Piprek, Efficiency droop in nitride-based light-emitting diodes. Physica Status Solidi A. Oct. 2010;207(10):2217-25.
Pourhashemi et al., High-power blue laser diodes with indium tin oxide cladding on semipolar ($20\bar{2}\bar{1}$) GaN substrates. Appl Phys Lett. 2015;106:111105.
Rogers et al., Synthesis, assembly and applications of semiconductor nanomembranes. Nature. Aug. 31, 2011;477(7362):45-53. doi: 10.1038/nature10381.
Ruoyuan et al., Wet oxidation of AlGaAs/GaAs distributed Bragg reflectors. Chin J Semiconductors. Aug. 2005;26(8):1519-23.
Sarzyński et al., Elimination of AlGaN epilayer cracking by spatially patterned AlN mask Appl Phys Lett. 2005;88:121124.
Someya et al., Room temperature lasing at blue wavelengths in gallium nitride microcavities. Science. Sep. 7, 1999;285(5435):1905-6.
Sundararajan et al., Gallium nitride: Method of defect characterization by wet oxidation in an oxalic acid electrolytic cell. J Vac Sci Tech B. Sep. 27, 2002;20(4):1339-41.
Tanaka et al., p-type conduction in Mg-doped GaN and $Al_{0.08}Ga_{0.92}N$ grown by metalorganic vapor phase epitaxy. Appl Phys Lett. 1994;65:593. doi: 10.1063/1.112309.
Todt et al., Oxidation kinetics and microstructure of wet-oxidized MBE-grown short-period AlGaAs superlattices. Mat Res Soc Symp Proc. 2002;692:561-6.
Vajpeyi et al., High Optical Quality Nanoporous GaN Prepared by Photoelectrochemical Etching. Electrochemical and Solid-State Letters. 2005;8(4):G85-8.

(56) References Cited

OTHER PUBLICATIONS

Waldrip et al., Stress engineering during metalorganic chemical vapor deposition of AlGaN/GaN distributed Bragg Reflectors. Appl Phys Lett. 2001;78:3205.

Wierer et al., Comparison between blue lasers and light-emitting diodes for future solid-state lighting. Laser Photonics Rev. Nov. 2013;7(6):963-93.

Yam et al., Porous GaN prepared by UV assisted electrochemical etching. Thin Solid Films. Elsevier, Amsterdam, NL, Feb. 15, 2007; vol. 515(7-8), pp. 3469-3474.

Yam et al., Structural and optical characteristics of porous GaN generated by electroless chemical etching. Mater Lett. 2008;63:724-7.

Yerino et al., Shape transformation of nanoporous GaN by annealing: From buried cavities to nanomembranes. Appl Phys Lett. Jun. 2011;98(25):251910.1-3. doi: 10.1063/1.3601861.

Zhang et al., A conductivity-based selective etching for next generation GaN devices. Physica Status Solidi B. Jul. 2010;247(7):1713-6. doi: 10.1002/pssb.200983650.

Zhang et al., Confinement factor and absorption loss of AlInGaN based laser diodes emitting from ultraviolet to green. J Appl Phys. 2009;105:023104.

Zhang et al., Mesoporous GaN for Photonic Engineering-Highly Reflective GaN Mirrors as an Example. ACS Photonics. 2015;2(7):980-6.

Zheng et al., Synthesis of Ultra-Long and Highly Oriented Silicon Oxide Nanowires from Liquid Alloys. Adv Mater. Jan. 2002;14(2):122-4.

Zhou et al., Near ultraviolet optically pumped vertical cavity laser. Electron Lett. 2000;36:1777-9.

\* cited by examiner

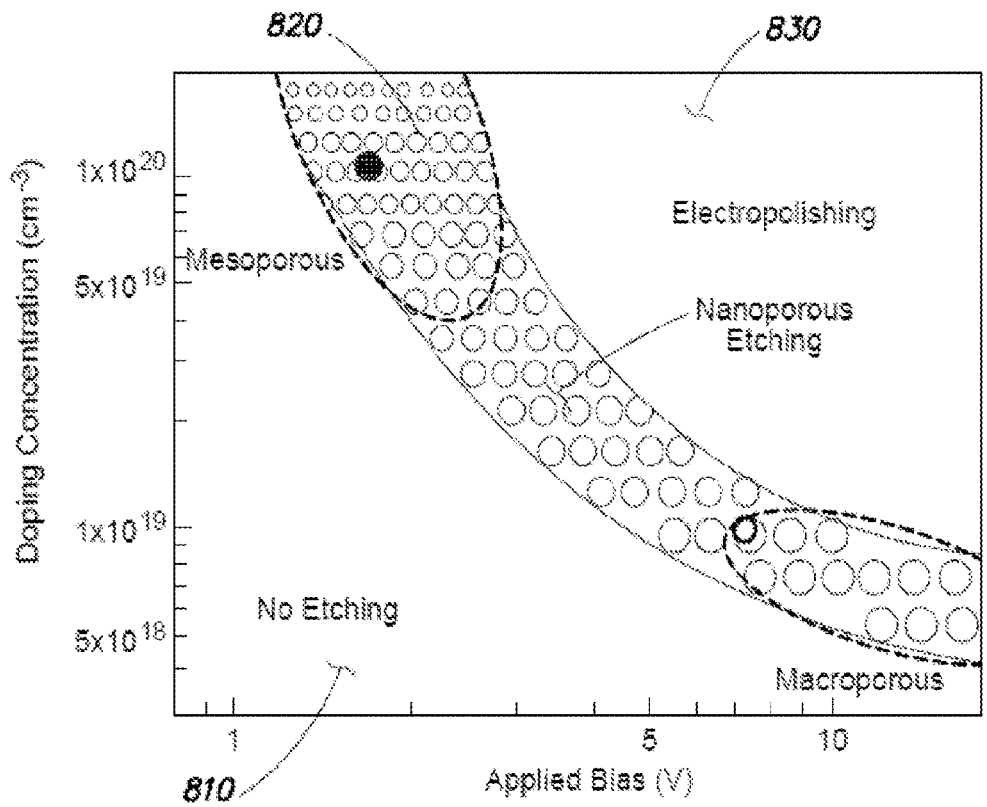
FIG. 8B
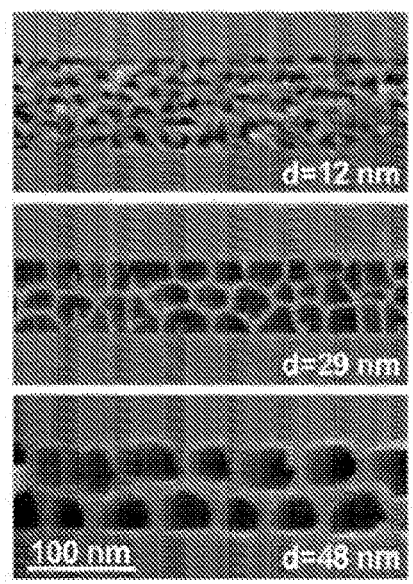
FIG. 8C
FIG. 8D
FIG. 8E

METHOD AND DEVICE CONCERNING III-NITRIDE EDGE EMITTING LASER DIODE OF HIGH CONFINEMENT FACTOR WITH LATTICE MATCHED CLADDING LAYER

RELATED APPLICATIONS

This application is a national stage of PCT/US2016/033270, entitled "A Method and Device Concerning III-Nitride Edge Emitting Laser Diode of High Confinement Factor with Lattice Matched Cladding Layer" filed May 19, 2016, which claims priority under 35 U.S.C. § 119(e) to U.S. Provisional Application Ser. No. 62/163,811, entitled "A Method and Device Concerning III-Nitride Edge Emitting Laser Diode of High Confinement Factor with Lattice Matched Cladding Layer" filed May 19, 2015. The contents of these applications are incorporated herein by reference in their entirety.

STATEMENT OF GOVERNMENT SUPPORT

This invention was made with government support under grant No. W911NF-09-1-0514 awarded by the U. S. Army Research Office. The government has certain rights in the invention.

BACKGROUND

Technical Field

The technology relates to edge-emitting laser diodes, such as edge-emitting III-nitride laser diodes.

Discussion of the Related Art

Conventional edge-emitting semiconductor lasers typically implement a separate confinement heterostructure (SCH). In this structure, an optical waveguide structure may comprise an active junction sandwiched between a top cladding layer and a bottom cladding layer. The cladding layers typically have a lower refractive index so an optical mode can be spatially confined within the waveguide structure. End mirrors or reflective semiconductor/air facets may provide additional optical confinement in a longitudinal direction (e.g., along the direction of laser emission), and may define a laser cavity. The waveguide structure may include an active region, usually multiple quantum wells, sandwiched between p-type and n-type semiconductor layers having a larger bandgap. The p-type and n-type layers help electrically and optically confine the stimulated emission within the active region. Both the optical confinement and the electrical confinement are needed for efficient lasing in the semiconductor structure.

In such a semiconductor laser design, lasing criterion is met if the round-trip optical gain ($g_{modal}$) exceeds the round-trip absorption ($\alpha_i$) and mirror losses ($\alpha_m$) in the laser cavity. The optical gain ($g_{modal}$) is proportional to the product of material gain ($g_{mat}$) and a confinement factor ($\Gamma$). The confinement factor represents a measure of the degree of transverse spatial overlap of the square of the amplitude of the electric field between the laser's active region (where population inversion takes place) and the laterally-confined optical mode. For higher lasing efficiency, it is desirable to increase the confinement factor.

SUMMARY

The inventors have conceived and developed methods and structures for making III-nitride edge-emitting laser diodes with a lattice-matched nanoporous n$^+$-type cladding layer. A highly-doped n$^+$-GaN cladding layer may be epitaxially grown as part of the laser diode structure. The structure may further comprise InGaN/GaN multiple quantum wells sandwiched between n-type GaN and p-type GaN semiconductor layers. The n$^+$-doped GaN layer is later selectively porosified by an electrochemical etching method, after which the material's refractive index significantly lowers while the layer remains highly conductive. The electrochemical porosification process creates an n-side (bottom-side) cladding layer with a high index contrast compared to an adjacent n-type GaN layer of the laser structure. Further, the porous cladding layer is both highly conductive and lattice matched with the adjacent layer. The matched lattice prevents material stress that might otherwise be present for other semiconductor laser diode structures having a high index contrast.

A transparent conductive oxide, such as indium tin oxide (ITO), may be subsequently deposited on top of the laser diode structure as the p-side cladding layer. The large index contrasts on both n and p sides can increase the optical confinement factor by more than a factor of two compared to conventional nitride laser diode structures that use AlGaN as cladding layers, for example. Moreover, the high-index contrast design can reduce the thickness of the p-type layers and possibly eliminate the AlGaN claddings on both sides of the laser diode's active region. Together with more conductive cladding layers, compared to the case of AlGaN, the overall diode resistance may be significantly reduced, which can further enhance the laser diode's performance (e.g., increase an operating speed and reduce ohmic heating losses).

Some embodiments relate to a semiconductor laser diode comprising an active region formed on a substrate and arranged for edge emission of a laser beam and a porous cladding layer formed between the substrate and the active region. In some aspects, a difference in a first refractive index value for the active region and a second refractive index value for the porous cladding layer is greater than 0.1. In some implementations, the porous cladding layer comprises n-doped GaN.

According to some aspects, a doping density of the porous cladding layer is between $1 \times 10^{18}$ cm$^{-3}$ and $1 \times 10^{19}$ cm$^{-3}$. A semiconductor laser diode may further comprise an n-type GaN layer having a doping level between $1 \times 10^{18}$ cm$^{-3}$ and $5 \times 10^{18}$ cm$^{-3}$ located between the porous cladding layer and the substrate. In some implementations, a porosity of the porous cladding layer is between 30% and 60%. In some implementations, an average pore diameter for the porous cladding layer is between 10 nm and 100 nm. A thickness of the porous cladding layer may be between 200 nm and 500 nm.

According to some implementations, the active region of a semiconductor laser diode comprises multiple-quantum wells. A semiconductor laser diode may further comprise a conductive oxide cladding layer formed on a side of the active region opposite the porous cladding layer. A semiconductor laser diode may have a one-dimensional optical confinement factor ($\Gamma_{1D}$) between 4% and 10%. In some implementations, the conductive oxide cladding layer comprises indium tin oxide. According to some implementations, a semiconductor laser diode may be incorporated as an optical source for a light that can be used in commercial or residential settings.

Some embodiments relate to a method for making a semiconductor laser diode. A method may comprise acts of forming an n+-doped GaN layer on a substrate; forming an active junction for and edge-emitting semiconductor laser diode adjacent to the n+-doped GaN layer; etching trenches through the active junction to expose a surface of the n+-doped GaN layer; and subsequently wet etching the n+-doped GaN layer to convert the n+-doped GaN layer to a porous cladding layer.

In some cases, a method may further comprise forming a conductive oxide cladding layer adjacent to the active junction. According to some implementations, a method may further comprise forming an n-type current spreading layer adjacent to the n+-doped GaN layer, wherein a doping concentration of the n-type current spreading layer is between $1 \times 10^{18}$ cm$^{-3}$ and $5 \times 10^{18}$ cm$^{-3}$.

In some aspects, forming an active junction comprises depositing n-type GaN, multiple quantum wells, and p-type GaN by epitaxy. In some implementations, the wet etching is performed after forming the active junction. According to some aspects, the wet etching comprises electrochemical etching that laterally porosifies the n+-doped GaN layer and does not require photo-assisted etching. The wet etching may use nitric acid as an electrolyte to porosify the n+-doped GaN layer. In some cases, the wet etching may use hydrofluoric acid as an electrolyte to porosify the n+-doped GaN layer. According to some implementations, the n+-doped GaN layer may have a doping concentration between $5 \times 10^{18}$ cm$^{-3}$ and $2 \times 10^{20}$ cm$^{-3}$.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated devices, only one device may be shown to simplify the drawings. In practice, a large number of devices may be fabricated in parallel across a large area of a substrate or entire substrate. Additionally, a depicted device may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

FIG. 8A and FIG. 8B depict electrochemical etching conditions, according to some embodiments;

FIGS. 8C-8E are SEM images showing nanoporous GaN formed under different electrochemical etching conditions.

Features and advantages of the illustrated embodiments will become more apparent from the detailed description set forth below when taken in conjunction with the drawings.

DETAILED DESCRIPTION

The inventors have recognized and appreciated that conventional III-nitride edge-emitting laser diodes, as well as edge-emitting laser diodes fabricated in other semiconductor materials (e.g., GaAs, InP, etc.), have solid semiconductor cladding layers (e.g., formed of AlGaN for a III-nitride system) that limit the refractive index contrast between the active region and cladding layers of the laser diodes. This limit in refractive index contrast means that the optical mode for the laser is often not well confined and spatially does not match well to the diode's active region (the region where stimulated emission occurs). As a result, the inventors have recognized and appreciated that the diode's efficiency is not as high as it could be.

Figure 1A:
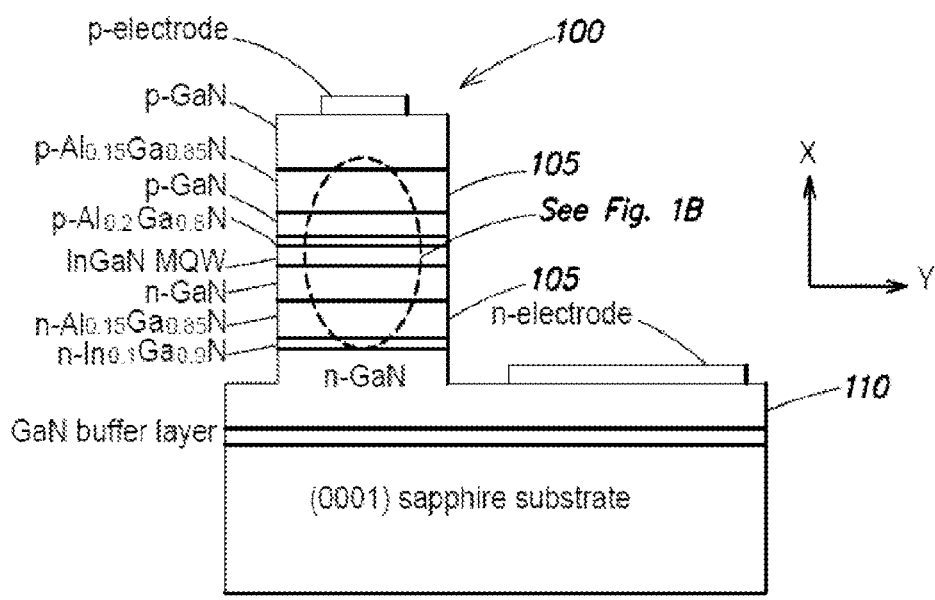
FIG. 1A depicts an elevation view of a semiconductor laser diode structure, according to some embodiments.
Figure 1B:
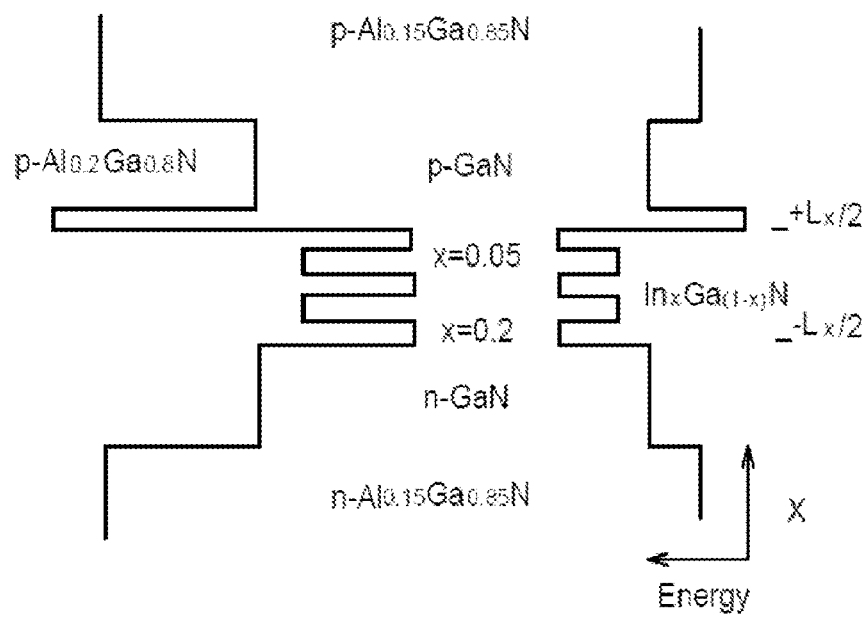
FIG. 1B depicts an energy band diagram for a semiconductor laser diode, according to some embodiments.

For example, III-nitride semiconductor laser diodes may comprise an SCH structure, like that of GaAs laser diodes. III-nitride laser diode structures may be grown on a GaN substrate or on a GaN template such as sapphire. AlGaN alloys (which have lower refractive index than GaN) may be grown in an epitaxial structure as the cladding layers, as depicted in FIG. 1A. The depicted laser diode structure 100 may be a conventional structure having two AlGaN cladding layers 105 (e.g., the two $Al_{0.15}Ga_{0.85}N$ layers). The inventors have recognized and appreciated that for III-nitride structures, there is a large lattice mismatch between AN and GaN that can significantly limit the freedom of the laser design compared to the lattice matched AlAs and GaAs in a III-arsenide laser structure.

To improve the optical confinement in the active region for a III-nitride laser, higher index contrast ($\Delta n = n_{activeregion} - n_{cladding}$) is preferred between the active region and cladding. Since the refractive index of AlGaN decreases with increasing Al ratio, higher Al ratio in the AlGaN cladding layer is needed for higher index contrast ($\Delta n = n_{GaN} \times n_{AlGaN}$). Preferably, $\Delta n$ needs to be at least 0.05. However, because of the lattice size decrease with increasing Al ratio in the AlGaN ternary crystal, the increasing lattice mismatch of the AlGaN epitaxial layer to the GaN layer induces increasing tensile strain on GaN. Excessive buildup of such strain can lead to numerous problems including macroscopic epitaxial structure bowing and cracking, and microscopic creation of misfit dislocations and V-shaped morphological defects when grown past a certain (critical) thickness. All these problems can be detrimental to the performance and reliability of the laser diode.

In practice, conventional Al compositions of AlGaN cladding layers have been in a range from 5% to 20% in UV, blue, and green laser diodes. This range of values produces a Δn of roughly 0.02 to 0.08 for AlGaN-cladded III-nitride laser diodes, which only marginally fulfills requirement for refractive index contrast. Because of the low index contrast, the optical confinement factor is only around 2% to 3% for III-nitride diode lasers, even with active regions increased to several hundreds of nanometers thick and cladding layers that are several microns thick. For reference, a one-dimensional confinement factor ($\Gamma_{1D}$), for purposes of calculations and numerical results described below, may be expressed as:

$$\Gamma_{1D} = \frac{\int_{-L_x/2}^{+L_x/2} E(x)^2 dx}{\int_{-\infty}^{+\infty} E(x)^2 dx}$$

where E(x) is the electric field amplitude for the optical mode in the x-direction. The mode confinement is roughly depicted as a dashed ellipse in FIG. 1A. The region having optical gain in the laser diode, where stimulated emission occurs (approximately equal to the region occupied by the multiple quantum wells), extends between $\pm L_x/2$.

A low transverse optical mode confinement in the x direction in FIG. 1A can cause a significant fraction of laser radiation to leak through the substrate and excite a substrate mode. Because an evanescent tail of the optical mode in the cladding layer may not decay abruptly, some fraction of the laser cavity mode can propagate into a thick n-type GaN layer 110 that underlies the laser heterostructure. Due to its high refractive index, the underlying GaN layer 110 can form a second parasitic waveguide, causing a significant leak of radiation from the active region and degradation of the transverse far-field pattern for the laser diode. As a result, the transverse mode can become a higher-order mode associated with the entire epitaxial structure 100. Such a mode shares its intensity with the thick GaN lateral contact layer underlying the laser heterostructure in which there is no optical gain, contributing to loss and reduced efficiency of the device.

To reduce the effect of the parasitic waveguide, the thickness of the cladding layer may be made sufficiently larger than the lateral expanse of the guided wave to reduce mode loss into the parasitic waveguide. For example, a group from Nichia Chemical reports using a very thick (5 μm thick) $Al_{0.05}Ga_{0.095}N$:Si bottom-side cladding layer. Osram OS reports suppression of substrate modes by increasing the thickness of the bottom-side cladding layer to 2 μm. To grow such thick AlGaN cladding layers without cracking, superlattice structures are needed that can better resist cracking for thicker layers. However, even with the complexity of these diode designs and superlattice epitaxy, the optical confinement factor remains below about 5%.

The inventors have also recognized and appreciated that an additional problem with AlGaN cladding is its conductivity, and also the conductivity for thick p-type doped GaN layers. Due to a deep level of Mg acceptor and low hole mobility in GaN, p-type GaN is of two orders of magnitude more resistive than Si-doped n-type GaN and still remains a bottleneck for III-nitride solid-state lighting. It has been reported that doping AlGaN with Mg is even less efficient than GaN, due to a difficulty in doping AlGaN. Thick cladding layers, required by low index contrast, and high resistivity will make the overall laser diode a more highly resistive electronic structure and less efficient, since a portion of the electrical current will be lost in ohmic heating of the resistive layers. The inventors have recognized and appreciated that AlGaN cladding layers in III-nitride lasers can adversely limit both optical confinement and electrical efficiency of a III-nitride laser diode.

To overcome limitations of solid AlGaN cladding layers, the inventors have conceived and developed methods and structures for forming porous cladding layers in III-nitride, edge-emitting laser diodes. The porous cladding layers can provide a high refractive index contrast and lower resistivity than conventional cladding layers. As a result, the porous layers can improve the confinement factor, the electrical efficiency, and overall emission efficiency of III-nitride, edge-emitting laser diodes. Porous cladding layers may also be used in edge-emitting laser diodes fabricated from other semiconductor materials. The inventors have also recognized and appreciated that efficient laser diodes may be useful high-intensity light sources instead of light-emitting-diodes (LEDs), because laser diodes emit light via stimulated emission which can avoid a phenomenon of "efficiency droop" that hampers performance of LEDs that emit light via spontaneous emission. Fabrication of an edge-emitting III-nitride laser diode with a nanoporous cladding layer will now be described.

Figure 2A:
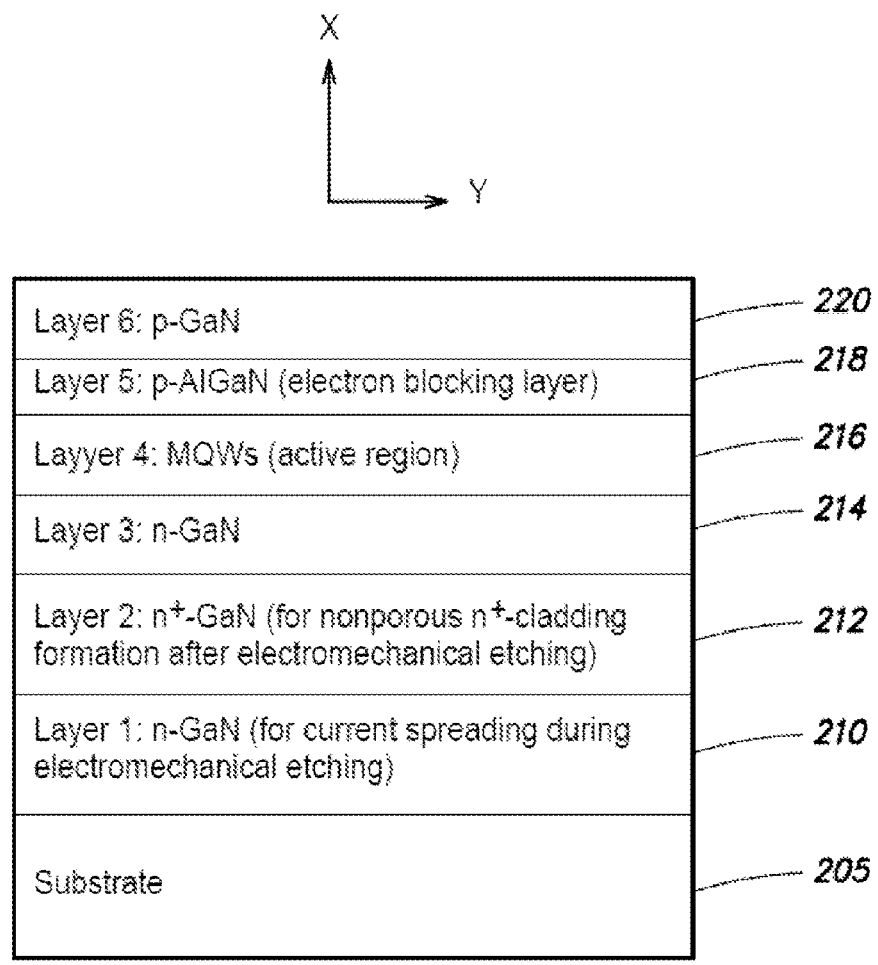
FIG. 2A depicts epitaxial layers for forming a III-nitride laser diode with a porous cladding layer, according to some embodiments.

According to some embodiments, a multi-layered semiconductor structure, as depicted in FIG. 2A, may be grown by metal organic chemical vapor deposition (MOCVD) or metal organic vapor phase epitaxy. An active region 216 may be sandwiched in a waveguide structure that includes n-type 214 and p-type 220 layers. In some embodiments, the active region may comprise multiple quantum wells (MQWs) as depicted. In other embodiments, the active region may comprise a depletion region of a p-n junction. A thin (10~20 nm) AlGaN electron-blocking layer 218 may be formed between the active region 216 and p-type layer 220 to improve electron confinement in the active region where recombination and photon emission occurs. The layers between and including n-type 214 and p-type 220 layers may comprise an active junction of the device. An n-type GaN layer 210 having a doping level varying from about $1 \times 10^{18}$ cm$^{-3}$ to about $5 \times 10^{18}$ cm$^{-3}$ may provide electrical current spreading across an adjacent n$^+$-type layer 212 during electrochemical etching of the adjacent layer and during device operation. In some cases, layer 210 may not be included. The n+-GaN layer 212 may be highly doped from about $5 \times 10^{18}$ cm$^{-3}$ to about $2 \times 10^{20}$ cm$^{-3}$ or above, so that electrochemical etching will produce a desirable nanoporous structure. In some implementations, the doping concentration of the n$^+$-GaN layer 212 is at least a factor of 5 greater than the doping concentration of the n-GaN layer 210, so that the electrochemical etch will selectively etch the n$^+$-GaN layer and not appreciably etch the n-GaN layer. Germanium (Ge) and/or silicon (Si) may be used as an n-type dopant for the n-type layers. A thickness of the n$^+$-GaN layer 212 may be between about 200 nm and about 500 nm.

To electrochemically etch the n$^+$-GaN layer, trenches may be etched into the epitaxial layers depicted in FIG. 2A or a mesa may be formed. The trenches may define a strip or bar-like structure for a laser cavity and expose sidewalls of the $n^+$-GaN layer 212. In some embodiments, the etching of trenches may define lateral confinement for an optical mode in the y direction. In other embodiments, a rib structure may be formed on top of the stack to define lateral confinement for an optical mode in the y direction.

Figure 2B:
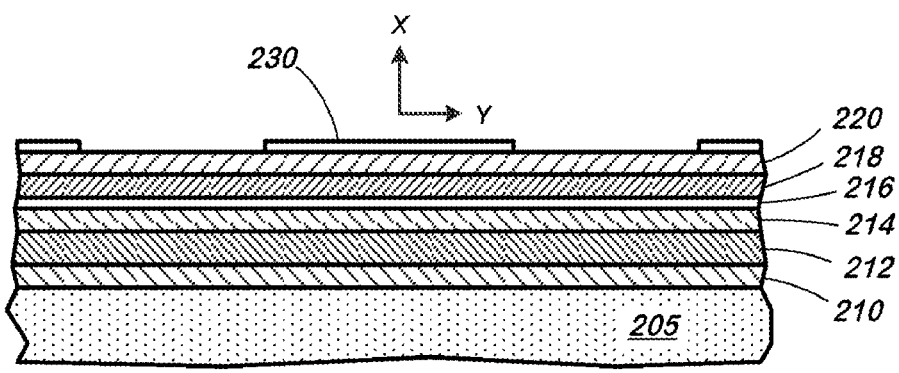
FIGS. 2B-2D depict structures associated with a method for forming a III-nitride laser diode with a porous cladding layer, according to some embodiments.
Figure 2C:
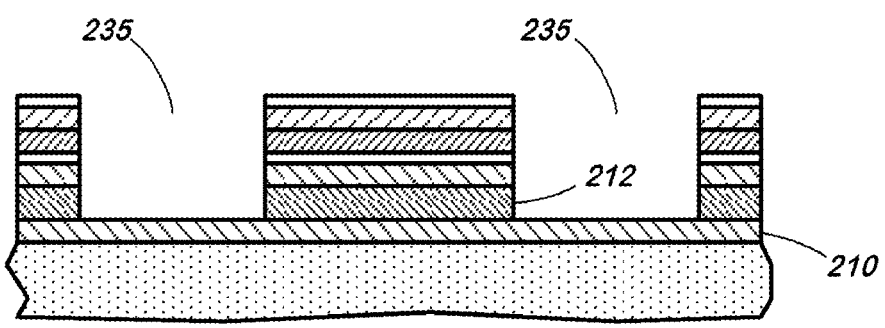

To form trenches, an oxide layer (e.g., $SiO_2$) may be deposited by plasma-enhanced chemical vapor deposition (PECVD) or any other suitable process over the stack. Other hard mask layer materials may be used in some embodiments. A pattern for the laser cavity may be transferred to the oxide layer using standard photolithography and wet or dry etching to create a hard mask 230, as depicted in FIG. 2B. The mask pattern may then be transferred to the stack using any suitable dry etching process for GaN. For example, a Cl-based, inductively-coupled plasma (ICP) etching process may be employed to selectively remove III-nitride layers to form trenches 235. The dry etching may be timed so that the etch depth extends into the $n^+$-GaN cladding layer 212 and exposes portions of the layer. The exposed portions of the $n^+$-GaN cladding layer 212 may then be subsequently etched via an electrochemical etching process. In some embodiments, the trenches 235 may extend at least to a bottom of the $n^+$-GaN cladding layer 212. On the other hand, the dry etching depth may not extend beyond the n-type layer 210, so that etching current can be spread across the whole wafer by layer 210 during the electrochemical etching. The etched structure may appear as depicted in FIG. 2C.

Figure 2D:
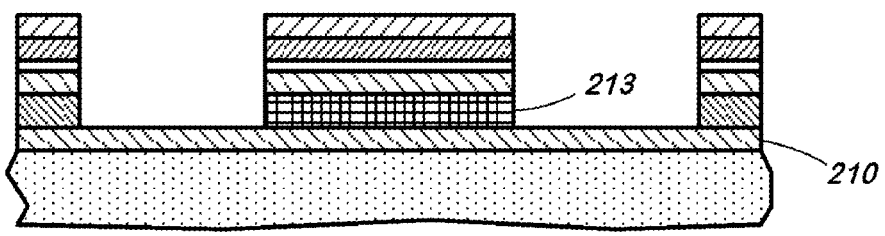

After the trenches 235 are formed, electrochemical (EC) etching may be performed to form a nanoporous $n^+$-GaN cladding layer 213, as depicted in FIG. 2D. The experimental set-up for electrochemical etching may comprise a set-up described in U.S. patent application Ser. No. 13/559,199, filed Jul. 26, 2012, which is incorporated herein by reference. The EC etching does not require optical radiation for etching GaN, as is the case for photoelectrochemical (PEC) etching. EC etching, according to the present embodiments, may comprise using highly concentrated nitric acid ($HNO_3$) at room temperature as the electrolyte. The concentration of the nitric acid may be between approximately 15 M and 18 M. In some embodiments, the nitric acid concentration is approximately 16.7 M or 70% by weight. The EC etching bias may be between 1 volt and 10 volts. The EC etching may laterally proceed into the $n^+$-GaN cladding layer 212 and continue until the layer becomes a porous layer 213, as indicated in FIG. 2D. The EC etch may be a timed etch. The mask 230 may be stripped from the wafer.

In other embodiments, other electrolytes may be used to porosify the $n^+$-GaN cladding layer 212. Other electrolytes include, but are not limited to, concentrated hydrofluoric acid, hydrochloric acid, sulfuric acid, and oxalic acid. Etchant concentrations, GaN doping, and bias voltages may be different for these etchants.

Figure 3:
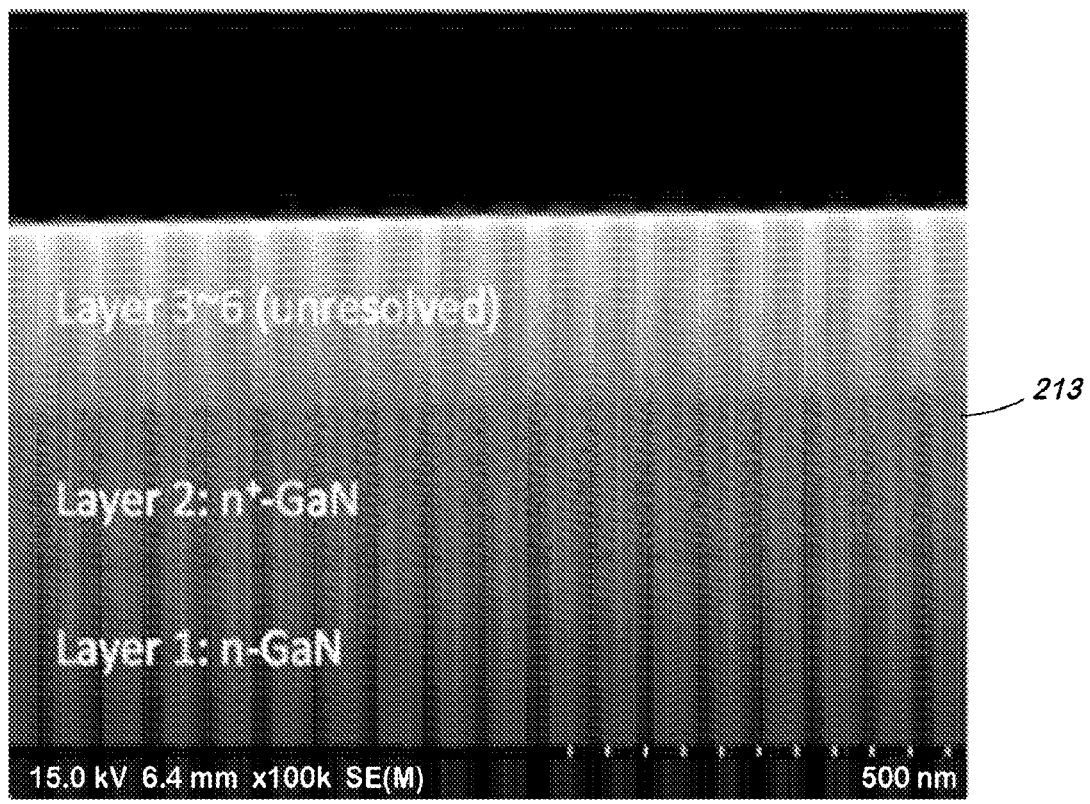
FIG. 3 is a scanning electron microscope (SEM) image showing a porous GaN layer.

FIG. 3 is a scanning electron microscope (SEM) image showing a porosified $n^+$-GaN cladding layer 213 after electrochemical etching. The pores appear as dark spots and are distributed uniformly throughout the layer. By controlling the doping level of the $n^+$-GaN layer 212, etchant concentration, and etching bias, the EC etching may controllably produce nanoscale pores (e.g., pores having an average diameter value that is between about 10 nm and about 100 nm in some embodiments, and between about 10 nm and about 40 nm in some cases). When the pore diameters are appreciably less than the wavelength of light in the medium and uniformly distributed, the pores can alter the effective refractive index of the medium rather than act as scattering sites. For blue and green-wavelength laser diodes, it may be desirable to have an average pore diameter less than about 40 nm in a porous cladding layer. Additionally, controlling the doping level, etchant concentration, etching bias, and etching time, the EC etching may controllably produce a desired porosity of the structure. The term "porosity" is used to refer to a ratio of void or pore volume in a layer to a total volume occupied by the porous layer.

Figure 4:
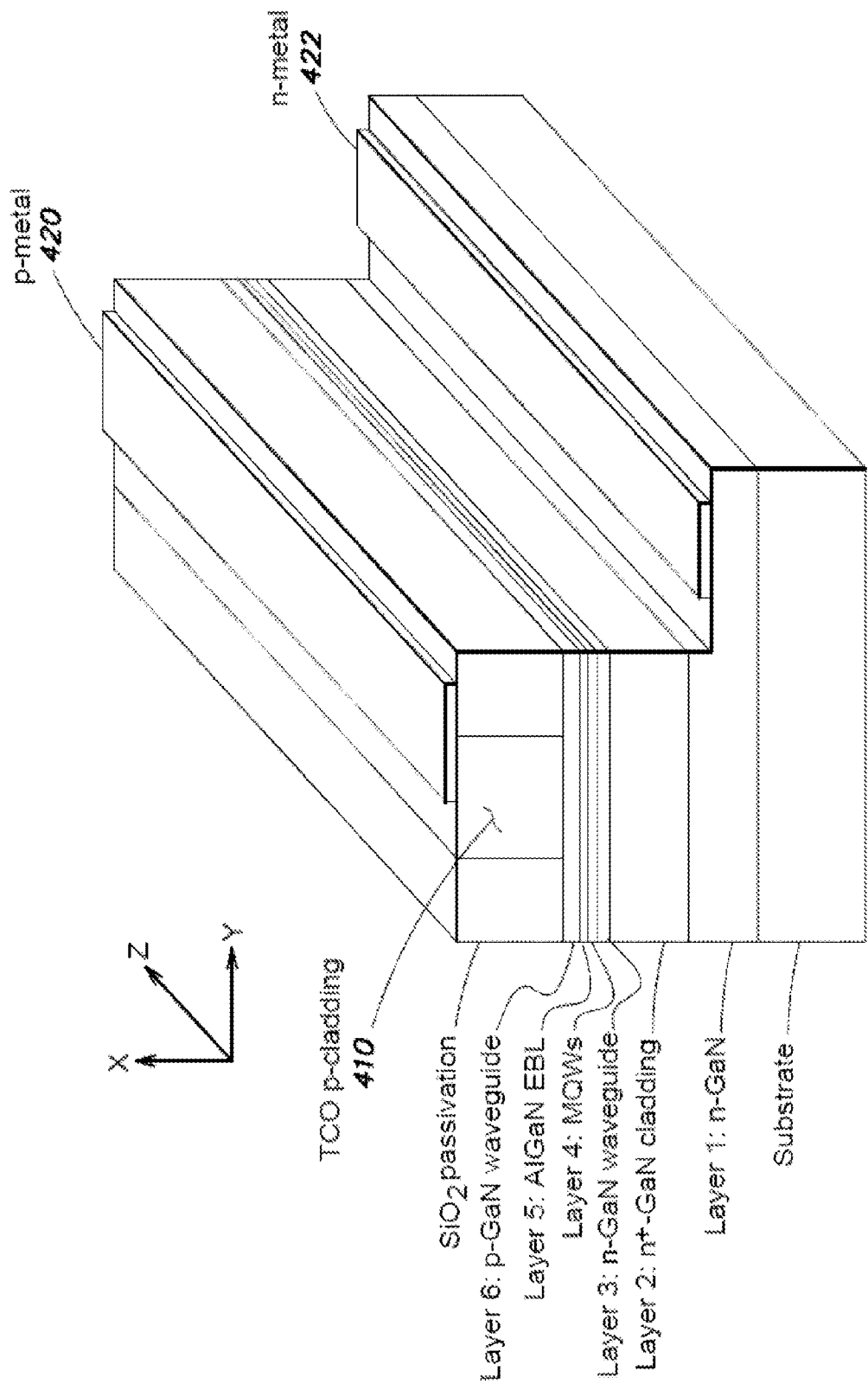
FIG. 4 depicts an edge-emitting semiconductor laser diode in perspective view; according to some embodiments.

In some embodiments, a transparent conductive oxide (TCO) may be deposited to form a p-type cladding layer 410, as depicted in FIG. 4. The TCO may comprise indium tin oxide (ITO), which has lower resistivity than p-type AlGaN. A passivation layer (e.g., an insulating oxide such as $SiO_2$) and contact pads 420, 422 may be added using conventional semiconductor manufacturing processes. In some embodiments, a passivation layer may be deposited prior to forming the contact pads, and vias may be opened in the passivation layer to make electrical contact with the laser diode.

The use of porous GaN and a TCO can eliminate the need for AlGaN cladding layers in a III-nitride laser diode structure. A porous GaN cladding layer may have several advantages over AlGaN cladding layers, as noted above. For example, a porous GaN layer can allow a high index contrast between the laser diode's active region 216 and porous cladding layer compared to a Δn of only about 0.02~0.08 when using AlGaN cladding. In some embodiments, the index contrast may be greater than about 0.5 (Δn≥0.5). In some implementations, Δn≥0.2. In some implementations, Δn≥0.1. Additionally, the porosified $n^+$-GaN layer is lattice matched to the adjacent layer, so that no significant material stress accumulates in the structure during epitaxial growth of the layers. Additionally, the porous $n^+$-GaN layer can exhibit a lower resistivity than conventional AlGaN cladding layers.

Figure 5:
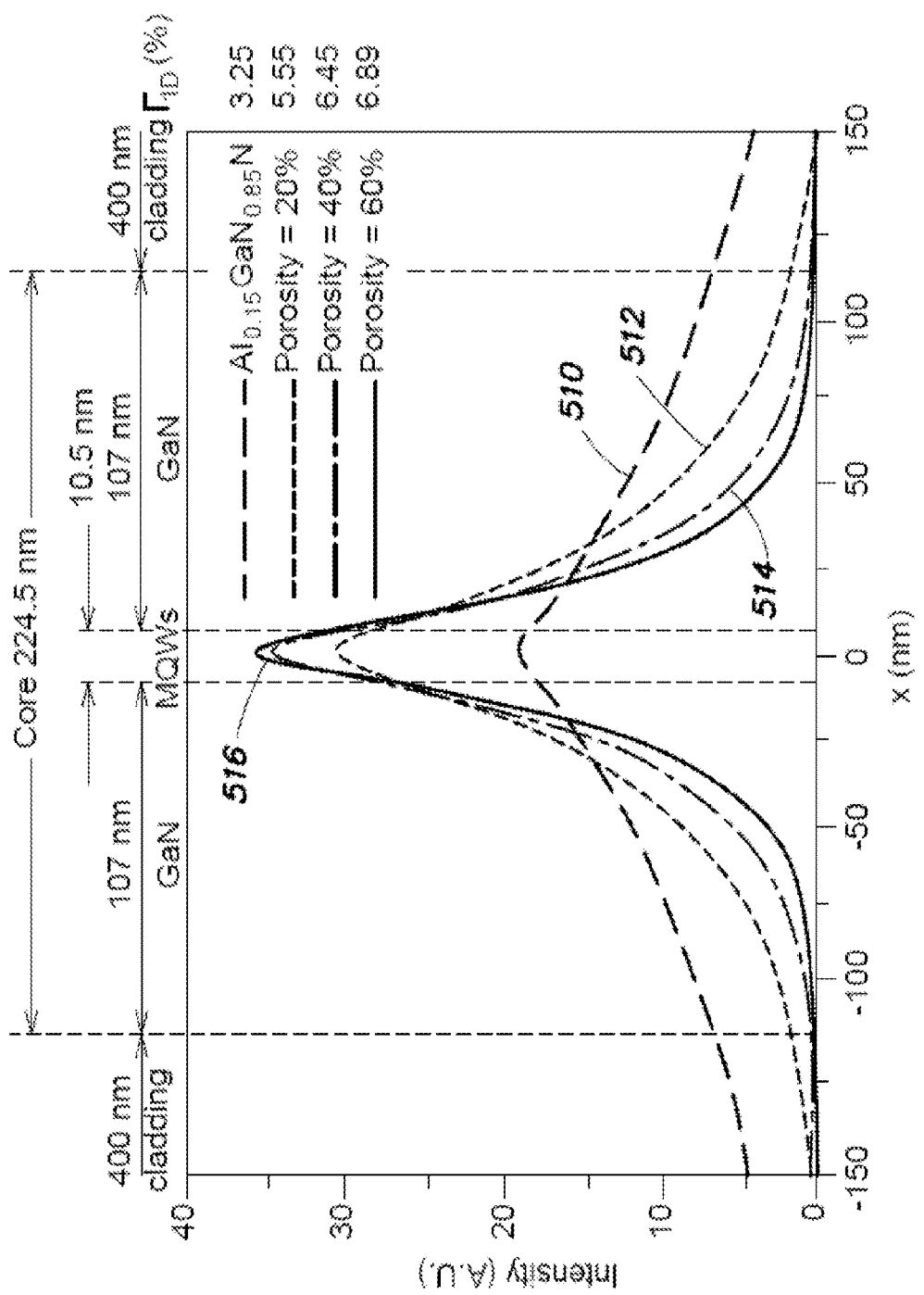
FIG. 5 illustrates optical mode confinement for waveguide structures cladded with non-porous AlGaN and porous GaN cladding layers.

Analytical calculations were carried out to study the effect of cladding layer porosity on optical confinement, and to compare mode confinement against conventional devices with AlGaN cladding layers. Numerical results from these calculations are plotted in FIG. 5, FIG. 6A, and FIG. 6B. For the calculations, a structure of the laser diode comprises two semiconductor layers 214, 220 about 107 nm thick and an active region 216 about 10 nm thick. The cladding layers are each about 400 nm thick. The calculations are made for four different cladding layers: AlGaN (curve 510), 20% porous GaN (curve 512), 40% porous GaN (curve 514), and 60% porous GaN (curve 516). Changing from AlGaN to a 20% porous GaN cladding layer increases the mode confinement factor $\Gamma_{1D}$ by nearly a factor of 2. As the porosity is increased, the optical mode becomes more tightly confined within the waveguide structure.

In terms of resistivity, the inventors have found through measurements that resistivity of nanoporous GaN scales monotonically with the porosity. After EC etching, the porous layer 213 may still have a doping concentration between about $1 \times 10^{18}$ cm$^{-3}$ and about $1 \times 10^{19}$ cm$^{-3}$. Since the $n^+$-GaN cladding layer may be initially doped above $5 \times 10^{19}$ cm$^{-3}$ before porosification, even with a porosity of 40% the carrier concentration level of the nanoporous layer remains above $2 \times 10^{18}$ cm$^{-3}$. Such a high carrier concentration yields a negligible resistivity for the porous GaN cladding (compared to conventional n-AlGaN cladding), while the index contrast Δn can be tuned to as high as 0.5. In some implementations, the porosity of the $n^+$-GaN cladding layer 213 is controlled via EC etching to be between about 30% and about 60%.

Figure 6A:
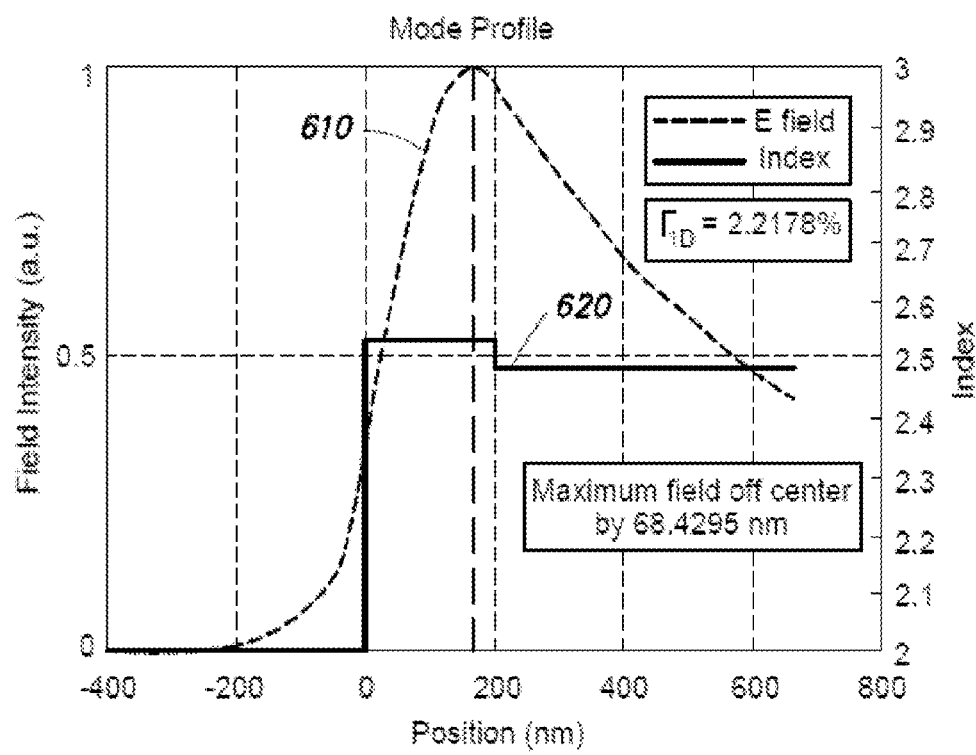
FIGS. 6A and 6B illustrate optical mode confinement for two different structures and refractive index profiles.

With a high index contrast between the n-GaN semiconductor layer 214 and the porous cladding layer 213, it is desirable to include a low index material as a p-type cladding layer to achieve a symmetrical mode profile in the laser diode and improved optical performance. According to some embodiments, a transparent conductive oxide such as ITO with a high index contrast to GaN ($\Delta n \sim 0.5$) can be used to replace a highly resistive and low-$\Delta n$ AlGaN p-type cladding. Although ITO has been proposed and used as a cladding layer for GaN laser diodes, its use without a porous bottom-side cladding layer can result in a highly asymmetric optical mode 610, as illustrated in FIG. 6A. In this structure, a substantial portion of the optical mode leaks outside the central waveguide region of the laser diode, where it will not experience optical gain. Also, a thick p-GaN layer 220 is still required adjacent the MQW active region to help reduce the asymmetry of the optical mode.

Figure 6B:
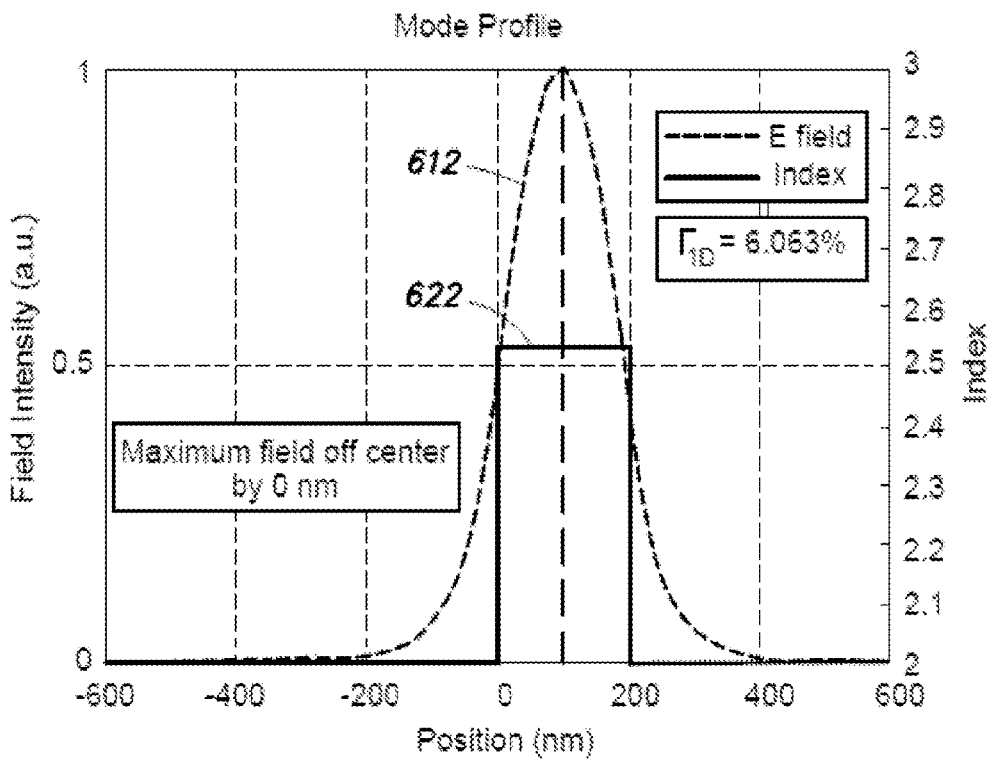

FIG. 6B shows improved optical mode confinement for an ITO p-side cladding layer and a nanoporous GaN n-side cladding layer. The porosity of the GaN layer is about 40%. The graph shows an approximately symmetric mode profile 622, centered at the active region. The confinement factor $\Gamma_{1D}$ is increased from about 2.22% for the case illustrated in FIG. 6A to about 6.06%. For reference, the refractive index values are plotted as segmented lines 620, 622 in the two graphs.

Figure 7:
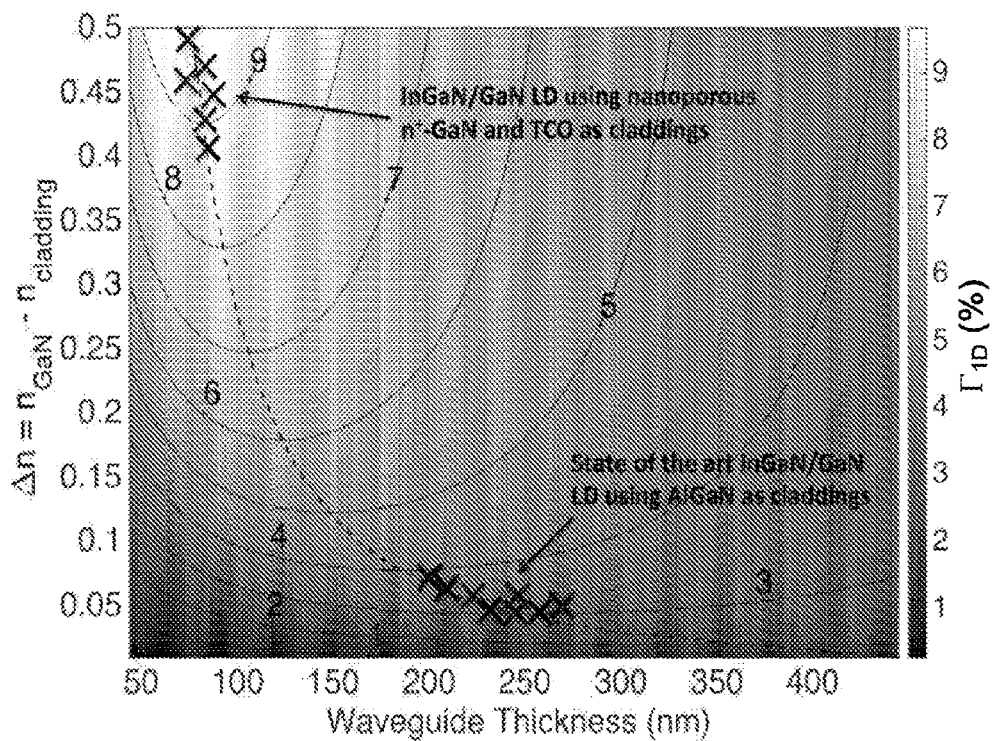
FIG. 7 depicts a three-dimensional plot of confinement factor $\Gamma_{1D}$ as a function of refractive index contrast and waveguide thickness. The dashed line indicates a higher confinement factor for a selected index contrast and preferred waveguide thickness.
Figure 8A:
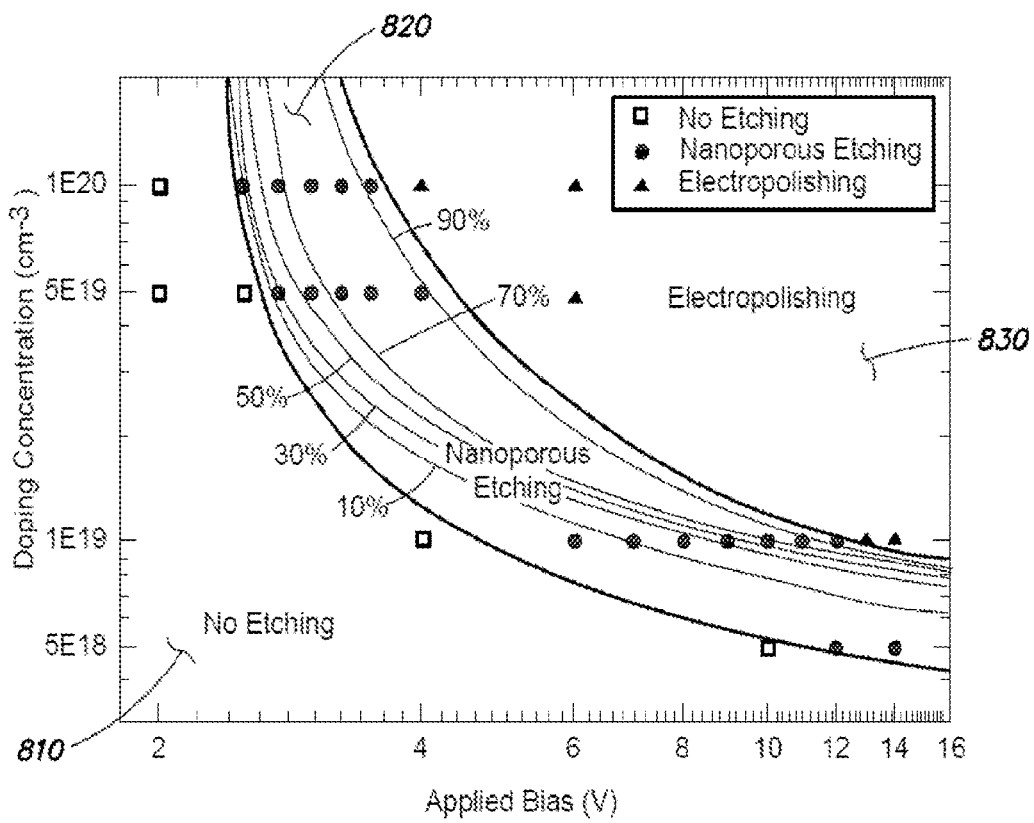

Numerical simulations were also carried out to plot the confinement factor $\Gamma_{1D}$ with varying index contrast and waveguide thickness. The results are depicted in the three-dimensional plot of FIG. 7. The plot includes iso-contours for different values of the confinement factor. The dashed line represents preferred values of waveguide thickness for any given index contrast. With an index contrast of 0.05, a preferred waveguide thickness yields a confinement factor $\Gamma_{1D}$ of only about 3%. For reference, conventional laser-diode structures with different $\Delta n$ values and waveguide thicknesses are marked near the bottom of the graph with crosses. The confinement factors for these conventional devices are all in the 2% to 4% range.

The use of a nanoporous, bottom-side or substrate-side cladding layer and conductive oxide top-side cladding layer can enable an index contrast of up to 0.5 on both sides of the laser-diode active region and yield a one-dimensional confinement factor greater than 9%, in some embodiments. The crosses near the top left of the graph show confinement factor values for different device structures that use nanoporous GaN and conductive oxide cladding layers. For these structures, the confinement factor has increased by more than a factor of two. In addition to better mode confinement, the preferred waveguide thickness is also reduced by more than a factor of two. The reduction in waveguide thickness, notably for the resistive p-type GaN waveguide layer, will lower the serial resistance of the laser diode and further improve the device performance.

Further details of EC etching are illustrated in FIGS. 8A-8E. For the graphs of FIG. 8A and FIG. 8B, a concentrated nitric acid (between 15M and 17M) is used as the electrolyte. Etching is performed at room temperature and under potentiostatic (constant voltage) bias. When a positive anodic bias is applied to an $n^+$-type GaN sample immersed in an acidic electrolyte, the $n^+$-GaN can become oxidized by holes at a surface inversion layer. The surface oxide layer is subsequently dissolved by the electrolyte. When the applied bias and/or the doping concentration is low, no chemical reactions occur and the $n^+$-GaN remains unetched. The region 810 of no etching is depicted at the lower left of the graphs. As the applied bias and/or the doping concentration increases, electrostatic breakdown occurs with the injection of holes to certain localized hot spots. This results in the formation of nanoporous structures, and is indicated by a curved central nanoporous region 820 in the graphs. At an even higher applied bias and/or with higher doping concentration, electro-polishing (complete etching) takes place and is indicated by the region 830 to the upper right in the graphs.

Within the nanoporous region 820, the inventors have found that the pore morphology can be controlled by the sample conductivity and the anodic bias. A higher doping level facilitates the formation of high curvature and smaller meso-pores, and the threshold bias of porosification is reduced accordingly. Tunability of pore morphology is illustrated in FIG. 8B and FIGS. 8C-8E. By varying the doping concentration of an $n^+$-GaN cladding layer from about $1 \times 10^{20}$ cm$^{-3}$ to about $1 \times 10^{19}$ cm$^{-3}$ and varying the EC etching bias between about 1 volt and about 12 volts, the resulting pore morphology can be varied from microporous (average pore diameter d~10 nm, FIG. 8C) to mesoporous (d~30 nm, FIG. 8D), and to macroporous (d~50 nm, FIG. 8E). Further, for a given doping concentration, the EC bias can be adjusted to alter the percent porosity of the cladding layer, as is depicted by the contour lines in the nanoporous region 820 of FIG. 8A.

Although the embodiments described above refer to electrically pumped laser diodes, the formation and use of porous cladding layers may be extended to optically-pumped, edge-emitting, semiconductor lasers or optical amplifiers. An optically-pumped device may be formed in the same way, although the top p-type GaN layer 220 may be replaced with a second n-type GaN layer 214, referring to FIG. 2A. The device may then be pumped with another laser or suitable optical source to create a population inversion in the MQW active region 216.

Figure 9:
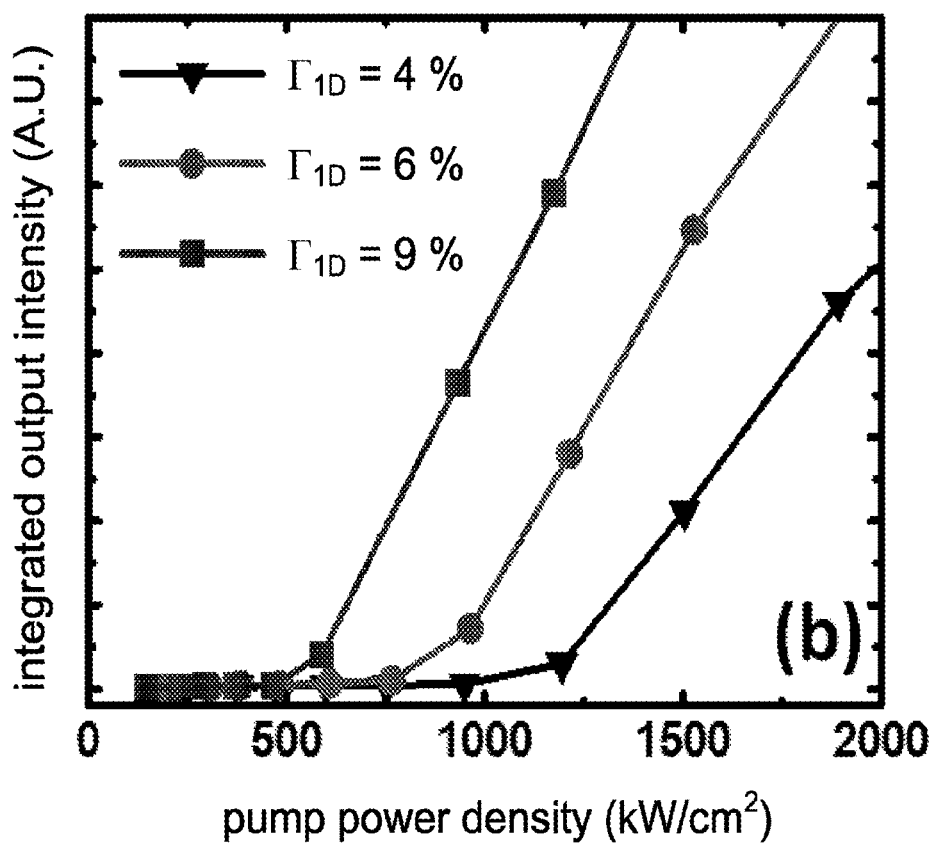
FIG. 9 shows stimulated emission from optically-pumped, edge-emitting, semiconductor lasers having porous cladding layers.

FIG. 9 shows stimulated emission from optically-pumped, edge-emitting, semiconductor lasers with porous cladding layers and having three different confinement factors. The integrated output intensity from the lasers are plotted as a function of optical pump power density delivered to the lasers. The curves show distinct threshold behavior for the three lasers. The threshold values reduce for increased confinement factors.

Nanoporous GaN cladding layers can be used to obtain high index contrast for cladding layers in edge-emitting III-nitride diode lasers, without problems of material stress and resistivity associated with AlGaN cladding layers. The nanoporous GaN cladding layers may be formed from layers grown using metal-organic epitaxial growth conditions, and may be formed in standard III-nitride epitaxial growth systems without significantly altering the growth processes. The porosification of a bottom-side cladding layer and deposition of a top-side TCO cladding layer may be performed after epitaxy, so that these acts will neither induce extra epitaxial constraints nor contribute to defect generation in the epitaxial layers. In some implementations, the fabrication steps may include conventional III-nitride device processes that can be applied in existing chip fabrication facilities. For example, electrochemical etching to form a porous III-nitride cladding layer can be an inexpensive and environmental-friendly technique. It may be conducted in existing chip fabrication facilities, and is compatible with high-volume production.

Numerical values and ranges may be given in the specification and claims as approximate values or exact values. For example, in some cases the terms "about," "approximately," and "substantially" may be used in reference to a value. Such references are intended to encompass the referenced value as well as plus and minus reasonable variations of the value. For example, a phrase "between about 10 and about 20" is intended to mean "between exactly 10 and exactly 20" in some embodiments, as well as "between 10±δ1 and 20±δ2" in some embodiments. The amount of variation δ1, δ2 for a value may be less than 5% of the value in some embodiments, less than 10% of the value in some embodiments, and yet less than 20% of the value in some embodiments. In embodiments where a large range of values is given, e.g., a range including two or more orders of magnitude, the amount of variation δ1, δ2 for a value could be 50%. For example, if an operable range extends from 2 to 200, "approximately 80" may encompass values between 40 and 120.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor laser diode comprising an active region formed on a substrate and arranged for edge emission of a laser beam and a porous cladding layer formed between the substrate and the active region, wherein the porous cladding provides a refractive index difference from the active region such that the laser diode has a one-dimensional confinement factor $\Gamma_{1D}$ between 4% and 10%, and wherein the confinement factor represents a ratio of an integrated transverse electric field squared of the laser beam confined within the active region to a total amount of transverse electric field squared for the laser beam.

2. The semiconductor laser diode of claim 1, wherein a difference in a first refractive index value for the active region and a second refractive index value for the porous cladding layer is greater than 0.2.

3. The semiconductor laser diode of claim 1, wherein the porous cladding layer comprises n-doped GaN.

4. The semiconductor laser diode of claim 3, wherein a doping density of the porous cladding layer is between $1\times10^{18}$ cm$^{-3}$ and $1\times10^{19}$ cm$^{-3}$.

5. The semiconductor laser diode of claim 4, further comprising an n-type GaN layer having a doping level between $1\times10^{18}$ cm$^{-3}$ and $5\times10^{18}$ cm$^{-3}$ located between the porous cladding layer and the substrate.

6. The semiconductor laser diode of claim 1, wherein a porosity of the porous cladding layer is between 30% and 60%.

7. The semiconductor laser diode of claim 6, wherein an average pore diameter for the porous cladding layer is between 10 nm and 100 nm.

8. The semiconductor laser diode of claim 1, wherein a thickness of the porous cladding layer is between 200 nm and 500 nm.

9. The semiconductor laser diode of claim 1, wherein the active region comprises multiple-quantum wells.

10. The semiconductor laser diode of claim 1, further comprising a conductive oxide cladding layer formed on a side of the active region opposite the porous cladding layer.

11. The semiconductor laser diode of claim 10, having a one-dimensional confinement factor $\Gamma_{1D}$ between 4% and 10%.

12. The semiconductor laser diode of claim 10, wherein the conductive oxide cladding layer comprises indium tin oxide.

13. The semiconductor laser diode of claim 1, incorporated as an optical source for a light.

14. A method for making a semiconductor laser diode, the method comprising:
    forming an n+-doped GaN layer on a substrate;
    forming an active junction for and edge-emitting semiconductor laser diode adjacent to the n+-doped GaN layer;
    etching trenches through the active junction to expose a surface of the n+-doped GaN layer; and
    subsequently wet etching the n+-doped GaN layer to convert the n+-doped GaN layer to a porous cladding layer that provides a refractive index difference from the active junction such that the laser diode has a one-dimensional confinement factor $\Gamma_{1D}$ between 4% and 10%, wherein the confinement factor represents a ratio of an integrated transverse electric field squared of the laser beam confined within the active junction to a total amount of transverse electric field squared for the laser beam.

15. The method of claim 14, further comprising forming a conductive oxide cladding layer adjacent to the active junction.

16. The method of claim 14, further comprising forming an n-type current spreading layer adjacent to the n+-doped GaN layer, wherein a doping concentration of the n-type current spreading layer is between $1\times10^{18}$ cm$^{-3}$ and $5\times10^{18}$ cm$^{-3}$.

17. The method of claim 14, wherein forming an active junction comprises depositing n-type GaN, multiple quantum wells, and p-type GaN by epitaxy.

18. The method of claim 14, wherein the wet etching is performed after forming the active junction.

19. The method of claim 14, wherein the wet etching comprises electrochemical etching that laterally porosifies the n+-doped GaN layer and does not require photo-assisted etching.

20. The method of claim 19, wherein the wet etching uses nitric acid as an electrolyte to porosify the n+-doped GaN layer.

21. The method of claim 19, wherein the wet etching uses hydrofluoric acid as an electrolyte to porosify the n+-doped GaN layer.

22. The method of claim 14, wherein the n+-doped GaN layer has a doping concentration between $5\times10^{18}$ cm$^{-3}$ and $2\times10^{20}$ cm$^{-3}$.

23. The method of claim 22, wherein the n+-doped GaN layer is the only layer having a doping concentration greater than $5\times10^{18}$ cm$^{-3}$ between the active junction and the substrate.

24. The semiconductor laser diode of claim 1, wherein the n+-doped GaN layer is the only layer having a doping concentration greater than $5\times10^{18}$ cm$^{-3}$ between the active region and the substrate.

* * * * *